United States Patent [19]

Aida et al.

[11] Patent Number: 4,772,817

[45] Date of Patent: Sep. 20, 1988

[54] CATHODE MOUNTING A HIGH-FREQUENCY PIEZOELECTRIC CHIP

[75] Inventors: Toshiyuki Aida, Chofu; Hiroshi Takeuchi, Matsudo; Sumio Hosaka, Tokyo; Shigeyuki Hosoki, Hachiouji; Tadashi Ikeda, Kanagawa, all of Japan

[73] Assignee: Hitachi, Ltd., Tokyo, Japan

[21] Appl. No.: 56,659

[22] Filed: Jun. 2, 1987

[30] Foreign Application Priority Data

Jun. 2, 1986 [JP] Japan .................................. 61-125743

[51] Int. Cl.$^4$ ........................................... H01L 41/08
[52] U.S. Cl. ..................................... 310/328; 310/360; 310/361
[58] Field of Search ................. 310/311, 328, 360, 361

[56] References Cited

U.S. PATENT DOCUMENTS

| | | | |
|---|---|---|---|
| 3,805,100 | 4/1974 | Klemp et al. | 310/328 X |
| 4,342,935 | 8/1982 | Kallmeyer et al. | 310/328 |
| 4,384,230 | 5/1983 | Wisner | 310/328 X |
| 4,438,364 | 3/1984 | Morison | 310/328 |

Primary Examiner—Mark O. Budd
Attorney, Agent, or Firm—Antonelli, Terry & Wands

[57] ABSTRACT

A piezoelectric crystal without spontaneous polarization such as $Li_2B_4O_7$ or quartz crystal is jointed to a cathode on the side opposite to the tip thereof to finely drive the cathode. The surface observation apparatus mounting the cathode makes it possible to observe the surface of a sample at high speeds.

4 Claims, 2 Drawing Sheets

CATHODE MOUNTING A HIGH-FREQUENCY PIEZOELECTRIC CHIP

BACKGROUND OF THE INVENTION

The present invention relates to a cathode of an apparatus which observes the surface condition with an electron beam as represented by a scanning tunneling microscope (STM).

In observing the surface condition of a sample by flowing a tunnel current by placing a cathode tip very close to the sample that serves as an anode, it is accepted practice to provide the cathode tip with a piezoelectric material such as $Pb(Zr, Ti)O_3$ (called PZT) and to move the cathode in very small amounts responsive to the change of the tunnel current in order to maintain constant the distance between the cathode and the anode as has been described, for example, in Drake et al., Rev. Sci. Instrum. 57(3), March 1986, pp. 441-445 and McCord et al., J. Vac. Sci. Technol. B4(1), January/February 1986, pp. 86-88. The scanning tunneling microscope employing a piezoelectric material has also been disclosed in Binnig et al., Surface Science 126(1983), pp. 236-244.

In general, a piezoelectric element of the stacked type has been used for coarse motion and a piezoelectric element of the single type has been used for fine motion. The piezoelectric material, however, consists of a sintered body which is a ferroelectric material having spontaneous polarization, so that it exhibits hysteresis and creeping characteristics in the strain thereof when a voltage is applied thereto. Therefore, the cathode must be driven with a frequency of as low as 1 KHz or lower. Because of this reason, it was so far impossible to measure the surface of sample at high speeds with a frequency of higher than 1 MHz.

The distance between the sample and the cathode tip undergoes the change due to expansion or contraction of the cathode tip that stems from the temperature change. Namely, error develops in the measurement. In order to prevent the development of error, it is desired to increase the scanning speed of the cathode tip. When it is required to grasp the surface condition of the sample in the form of signals of a high frequency, furthermore, the object cannot be sufficiently achieved with the traditionally employed frequency of lower than 1 KHz.

SUMMARY OF THE INVENTION

The object of the present invention is to provide a cathode which makes it possible to measure or observe the surface of a sample at high speeds, the cathode being adapted to an apparatus such as an STM that is designed to observe the surface condition of the samples with an electron beam.

In order to achieve the above object, the cathode of the present invention has at least one piezoelectric single crystal without spontaneous polarization, which is joined to the cathode tip. The piezoelectric single crystal without spontaneous polarization is used as a piezoelectric material for finely moving the cathode. The piezoelectric single crystal is free from spontaneous polarization due to ionic polarization or dipole polarization, and its polarization is induced by the external electric field. Examples of such piezoelectric crystals include a crystal composed of $Li_2B_4O_7$ and quartz crystal.

In such piezoelectric crystals, polarization partly takes place as the electrons undergo the shift relative to nuclei in the atoms, and follows a high-frequency driving of higher than 1 MHz without substantially exhibiting hysteresis in the strain that usually results from the switch on or off of voltage.

The piezoelectric crystal is mounted on a side (hereinafter referred to as rear side of the tip) opposite to the cathode tip, and is provided with two electrodes for applying a driving voltage. Generally, there is used in combination with a piezoelectric crystal such as PZT for coarse motion, which undergoes displacement to a great degree when a voltage is applied thereto. In this case, to the rear side of the cathode tip are joined in cascade a piezoelectric crystal for fine motion without spontaneous polarization and a piezoelectric crystal such as a conventional PZT for coarse motion which exhibits spontaneous polarization and which undergoes displacement to a great degree. It needs not be pointed out that the crystal such as PZT too is provided with two electrodes for driving in a customary manner. As is well known, furthermore, the cathode tip is provided with an electrode for applying a voltage across it and the sample. Conductors are connected to the electrodes.

The shape and size of the piezoelectric material for fine motion can be determined referring to the shape and size of a piezoelectric material such as PZT in the conventional art. When the piezoelectric material for coarse motion is to be used in combination, however, the piezoelectric material for fine motion must have a shape and a size adapted to be connected thereto. Needless to say, the shape and size of the piezoelectric material may be suitably determined depending upon experiments.

DESCRIPTION OF THE PREFERRED EMBODIMENTS

First, described below is a relationship between the applied voltage and the strain of the $Li_2B_4O_7$ single crystal employed in the embodiments of the present invention, in comparison with that of the conventional PZT.

Figure 2A:
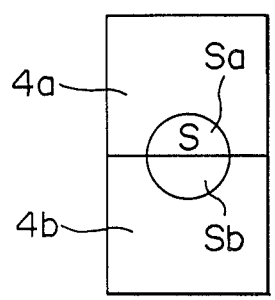
FIG. 2 is a diagram illustrating a relationship between the applied voltage and the strain of a $Pb(Zr, Ti)O_3$ ceramic piezoelectric element employed in the conventional technology.
Figure 2B:
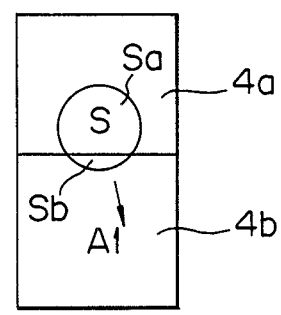

FIG. 2 illustrates a relationship between the strain and the applied voltage of a conventional piezoelectric ceramic element which contains $PbZrO_3$ and $PbTiO_3$ in an equimolar amount. The sample is 4 mm thick. Application of a voltage of 100 volts produces a strain of as great as 0.15 μm. However, large hysteresis is undesirably exhibited when the voltage is switched on and off.

Figure 1:
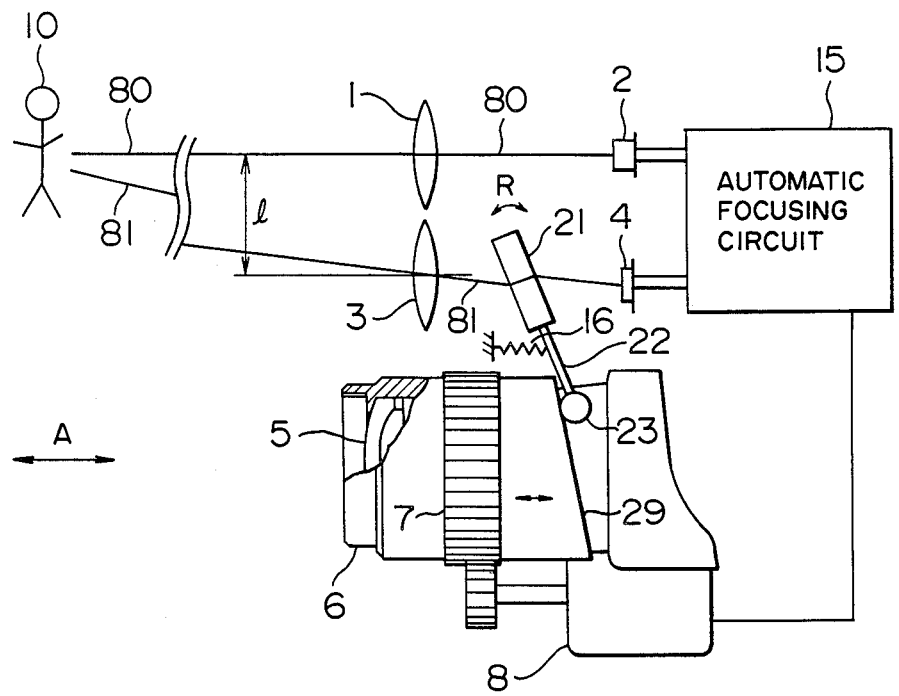
FIG. 1 is a diagram illustrating a relationship between the applied voltage and the strain of a piezcelectric element composed of an $Li_2B_4O_7$ single crystal employed in an embodiment of the present invention.

FIG. 1 shows a relationship between the strain and the applied voltage of the $Li_2B_4O_7$ single crystal employed in the embodiment of the present invention. The sample has a thickness of 1.5 mm. The strain stands for an amount of elongation in the Z-axis direction when a voltage is applied to the crystal in the Z-axis direction.

The strain is as small as 0.1 μm even when a voltage of 1000 volts is applied, but no hysteresis is observed. The $Li_2B_4O_7$ single crystal exhibits characteristics that do not change even when the external temperature is changed over a range of from 0° C. to 50° C.

The above-mentioned results can be verified by the facts that the $Pb(Zr, Ti)O_3$ exhibits a large spontaneous polarization inside thereof, whereas the $Li_2B_4O_7$ exhibits induced polarization only. In the case of the $Pb(Zr, Ti)O_3$, furthermore, the absolute value of elongation decreases as the frequency for applying voltage becomes greater than 1 KHz. In the case of the $Li_2B_4O_7$, on the other hand, the absolute value of elongation does not decrease even with a frequency of as high as 10 MHz.

A quartz crystal also exhibits the same characteristics as those of the $Li_2B_4O_7$. However, the absolute value of elongation for the same voltage is one-tenth that of the $Li_2B_4O_7$ crystal.

EMBODIMENT 1

Figure 3:
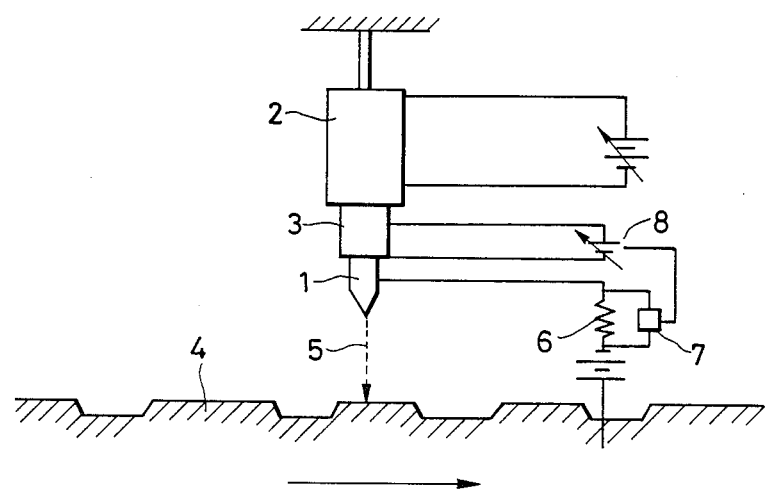
FIG. 3 is a diagram which schematically illustrates a scanning tunneling microscope mounting the $Li_2B_4O_7$ single crystalline piezoelectric element according to the embodiment of the present invention.

FIG. 3 is a diagram which schematically explains the scanning tunneling microscope with a cathode mounting a high-frequency piezoelectric chip employing $Li_2B_4O_7$ crystal according to an embodiment of the present invention. The apparatus for testing was constructed in the same manner as the one disclosed in the aforementioned McCord et al., J. Vac. Sci. Technol. B4(1), January/February 1986, pp. 86–88.

Onto a tungsten cathode tip 1 having a diameter of 0.15 mm and a length of 4 mm were attached using an adhesive and in cascade a square $Pb(Zr, Ti)O_3$ ceramics (PZT) piezoelectric element 2 for coarse motion each side measuring 5 mm and having a length of 18 mm and a square $Li_2B_4O_7$ crystal piezoelectric element 3 each side measuring 5 mm and having a length of 10 mm. A distance of about 20 angstroms was maintained between the cathode tip 1 and a silicon plate 4 which was a sample to be measured and which also served as an anode, thereby to generate a tunnel current 5. In bringing the cathode chip 1 close to the silicon plate 4, the distance therebetween was adjusted using the PZT piezoelectric element 2. A tunnel current 5 of 1 nA was obtained when a voltage of about 1 volt was applied across the cathode tip 1 and the silicon plate 4. The silicon plate 4 possessed many steps having a height of about 10 angstroms. The steps were observed using the $Li_2B_4O_7$ crystal piezoelectric element 3 for fine motion. As the silicon plate was finely moved at a speed of about 1 cm/sec., the electric current changed at a frequency of as high as about 1 MHz. In order to maintain the tunnel current of 1 nA constant without the current change that stems from the change of distance between the cathode and the anode, the applied voltage 8 was changed through a servo amplifier 7 referring to the applied voltage vs. strain characteristics of the $Li_2B_4O_7$ crystal that have been measured already as shown in FIG. 1 so that a voltage between the terminals of a resistor 6 having a resistance of 10 megohms was maintained at 10 mV, in an attemp to maintain constant the distance between the cathode and the anode. As a result, the $Li_2B_4O_7$ crystal piezoelectric member responded to the change of current of about 1 MHz, and the tunnel current of 1 nA could be maintained by maintaining the distance between the tungsten cathode and the silicon plate to be 20 angstroms constant. Measurement of the voltage applied to the $Li_2B_4O_7$ crystal made it possible to observe fine structure on the silicon surface at high speeds.

When the steps were observed, as heretofore, using the PZT piezoelectric element 2 only without using the $Li_2B_4O_7$ crystal, the device worked properly only when the current possessed a frequency of smaller than 1 KHz.

Electrodes of the cathode tip, PZT piezoelectric crystal, and $Li_2B_4O_7$ piezoelectric crystal were formed by forming s silver paste film on evaporated film of gold. Conductcrs were connected to these electrodes. The voltage was applied to the piezoelectric crystals in the axial direction thereof, so that the crystals were expanded or contracted in the axial direction thereof. The Z-axis of the $Li_2B_4O_7$ crystal was brought into agreement with the axial direction of the cathode.

Generally, an electric current that flows between the cathode tip and the anode becomes a tunnel current when the distance between the two is smaller than about 20 angstroms, becomes a field emission current when the distance is greater than about 50 angstroms, and becomes a transition region when the distance is from 20 to 50 angstroms.

EMBODIMENT 2

Using the same apparatus as that of FIG. 3, a field emission current outside the tunneling current region was drawn maintaining a distance of 1 μm between the tungsten cathode tip 1 and the silicon plate 4, in order to measure the steps having a height of about 100 angstroms on the silicon surface. A current of 1 nA was obtained by the application of a voltage of about 100 volts. Like in the Embodiment 1, the field emission current could be maintained at 1 nA constant, even when the silicon plate was moved at high speeds, by applying the voltage 8 to the $Li_2B_4O_7$ single crystal changing over a range of 0 to 1000 volts at a frequency of as high as about 1 MHz, such that the distance was maintained constant between the cathode and the anode. In this case, coarse structure of 100 to 1000 angstroms on the silicon surface could be identified at high speeds.

As explained in the Embodiment 1, furthermore, when the steps were observed using the PZT piezoelectric element 2 only without using the $Li_2B_4O_7$ crystal, as in a draditional manner, it was allowed to use the electric current of a frequency of smaller than 1 KHz only.

According to the present invention, as will be obvious from the above description, the surface condition of the anode can be processed using signals of a frequency of greater than about 1 MHz, making it possible to carry out the high-speed image scanning in a scanning tunneling microscope or the like.

Incidentally, in the cathode mounting a high-frequency piezoelectric chip of the present invention, conventional knowledges and known teachings may be adopted in connection with matters not specifically described in the present specification

What is claimed is:

1. A cathode mounting a high-frequency piezoelectric chip, which comprises a cathode tip arranged maintaining a gap with respect to a sample to be measured that serves as an anode, and at least one piezoelectric crystal chip without spontaneous polarization that is joined to said cathode tip, said cathode tip being mounted on said piezoelectric crystal chip to be displaced by the strain of said piezoelectric crystal chip, and said piezoelectric crystal chip without spontaneous polarization being composed of an $Li_2B_4O_7$ or a quartz crystal.

2. A cathode mounting a high-frequency piezoelectric chip according to claim 1, wherein a piezoelectric crystal for coarse motion having spontaneous polarization is joined in cascade to said piezoelectric crystal without spontaneous polarization.

3. A cathode mounting a high-frequency piezoelectric chip according to claim 1, wherein said piezoelectric crystal without spontaneous polarization is composed of an $Li_2B_4O_7$.

4. A cathode mounting a high-frequency piezoelectric chip according to claim 2, wherein said piezoelectric crystal without spontaneous polarization is composed of an $Li_2B_4O_7$.

* * * * *